United States Patent
Park et al.

(10) Patent No.: US 10,573,774 B2
(45) Date of Patent: Feb. 25, 2020

(54) METHOD OF FORMING ELECTRODES FOR ELECTRONIC DEVICE USING TWO DIMENSIONAL SEMICONDUCTOR AND ELECTRONIC DEVICE THEREOF

(71) Applicant: RESEARCH & BUSINESS FOUNDATION SUNGKYUNKWAN UNIVERSITY, Suwon-si (KR)

(72) Inventors: Jin Hong Park, Hwaseong-si (KR); Hyung Youl Park, Gimpo-si (KR); Jeong Hoon Kim, Seongnam-si (KR); Woo Young Choi, Changwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 314 days.

(21) Appl. No.: 15/437,547

(22) Filed: Feb. 21, 2017

(65) Prior Publication Data

US 2017/0243998 A1 Aug. 24, 2017

(30) Foreign Application Priority Data

Feb. 18, 2016 (KR) ........................ 10-2016-0018873

(51) Int. Cl.
*H01L 31/072* (2012.01)
*H01L 31/0224* (2006.01)
*H01L 31/028* (2006.01)
*H01L 31/18* (2006.01)

(52) U.S. Cl.
CPC .......... *H01L 31/072* (2013.01); *H01L 31/028* (2013.01); *H01L 31/0224* (2013.01); *H01L 31/022466* (2013.01); *H01L 31/1864* (2013.01); *H01L 31/1884* (2013.01); *Y02E 10/547* (2013.01); *Y02P 70/521* (2015.11)

(58) Field of Classification Search
None
See application file for complete search history.

(56) References Cited

U.S. PATENT DOCUMENTS

2014/0197459 A1* 7/2014 Kis .................. H01L 29/66742
257/194

OTHER PUBLICATIONS

Park et al., ACS Nano, vol. 9, No. 3, 2368-2376 (2015). (Year: 2015).*
Hyung-Youl Park et al., "Extremely Low Contact Resistance on Graphene through n-Type Doping and Edge Contact Design." *Advanced Materials* 28.5 (2016):864-870.

* cited by examiner

*Primary Examiner* — Eli S Mekhlin
(74) *Attorney, Agent, or Firm* — NSIP Law

(57) ABSTRACT

In case of forming electrodes for electronic device using a two-dimensional semiconductor, a two-dimensional semiconductor layer doped into n-type or p-type is formed on a substrate, a first area and a second area of the doped two-dimensional semiconductor layer is patterned into a predetermined pattern shape, and a first electrode and a second electrode are formed on the patterned first and second areas, respectively.

5 Claims, 14 Drawing Sheets

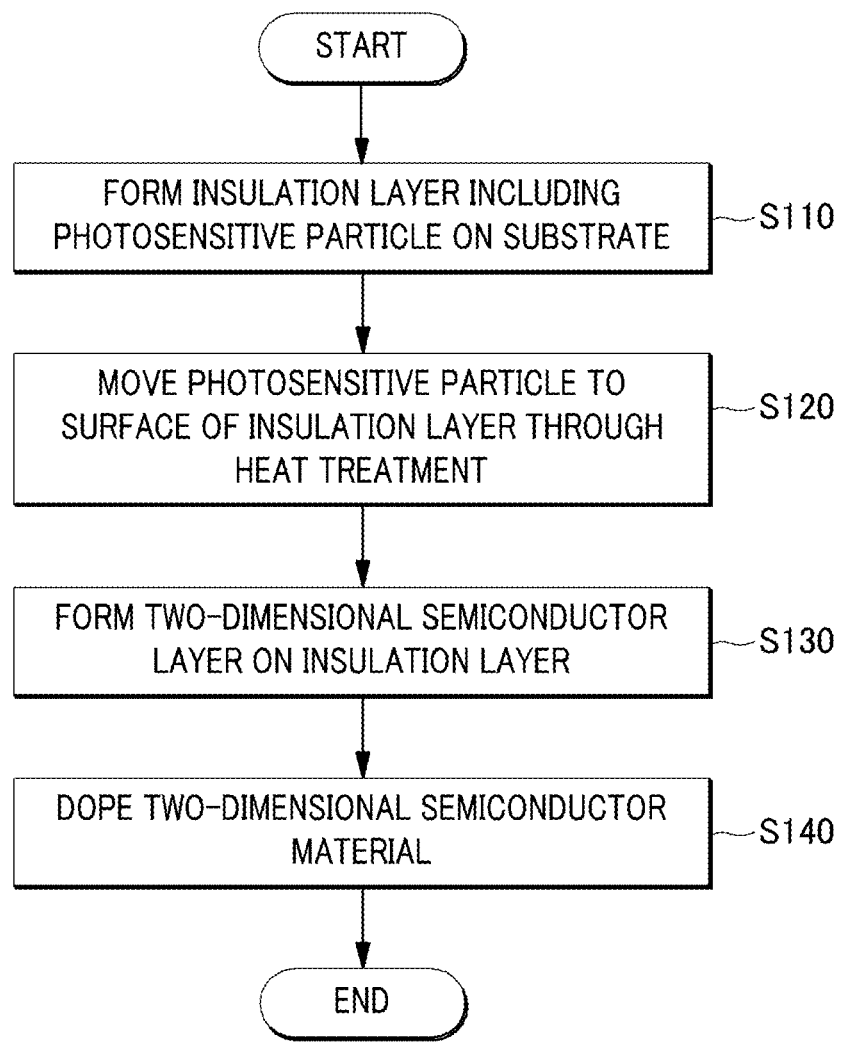

FIG. 6
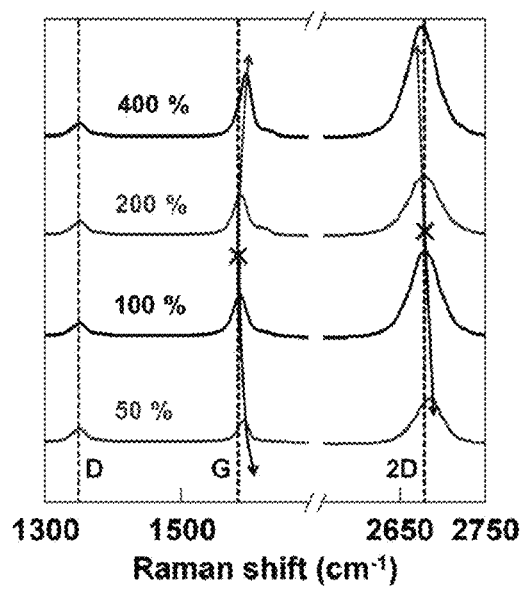 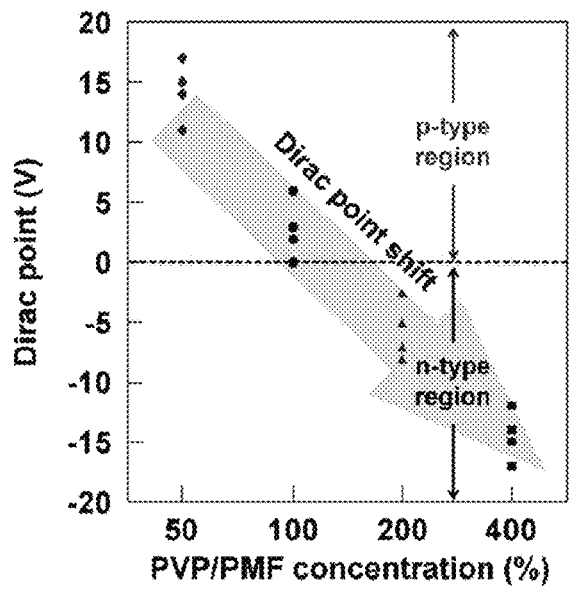
(a) (b)

METHOD OF FORMING ELECTRODES FOR ELECTRONIC DEVICE USING TWO DIMENSIONAL SEMICONDUCTOR AND ELECTRONIC DEVICE THEREOF

CROSS-REFERENCE TO RELATED APPLICATIONS

This application claims the benefit under 35 USC 119(a) of Korean Patent Application No. 10-2016-0018873 filed on Feb. 18, 2016 in the Korean Intellectual Property Office, the entire disclosure of which is incorporated herein by reference for all purposes.

TECHNICAL FIELD

The present disclosure relates to a method of forming electrodes for electronic device using a two-dimensional semiconductor and an electronic device thereof.

BACKGROUND

Two-dimensional semiconductors have excellent electrical, mechanical, and optical properties and thus are drawing a lot of attention as next-generation semiconductor materials which can be applied to flexible devices and transparent devices.

In this regard, Korean Patent No. 10-1251340 (entitled "Light emitting diode and manufacturing method of the same") discloses a semiconductor light emitting diode and a method of manufacturing the semiconductor light emitting diode in which a two-dimensional photonic crystal pattern is formed in an interface of a transparent electrode layer with a p-type semiconductor layer, so that light extraction efficiency can be improved, and a contact area between the p-type semiconductor layer and the transparent electrode layer is reduced, so that conducting properties of the semiconductor light emitting diode can be improved.

In a process of manufacturing an electronic device using a two-dimensional semiconductor material, a method of forming an electrode on a two-dimensional semiconductor is very important because a contact resistance between the two-dimensional semiconductor and the electrode varies depending on the method used.

That is, the contact resistance between the two-dimensional semiconductor and the electrode highly affects the performance of the device. Therefore, a method of reducing the contact resistance between the two-dimensional semiconductor and the electrode is becoming an issue.

Conventionally, the contact resistance between the two-dimensional semiconductor and the electrode has been reduced by changing properties of the electrode or brining the electrode into contact with an edge of the two-dimensional semiconductor.

Specifically, according to a method of reducing the contact resistance by changing properties of the electrode, a change in density of states of the two-dimensional semiconductor is caused by physical or chemical adsorption between the electrode and the two-dimensional semiconductor in contact with the electrode depending on properties of the electrode. Meanwhile, metal which is a three-dimensional material has a sufficient amount of charges (electrons/holes) to be transferred to a semiconductor layer, whereas a two-dimensional semiconductor material is limited in space to receive charges transferred from metal and thus has a high contact resistance. Further, the two-dimensional semiconductor material does not include a dangling bond on its surface. Therefore, if the two-dimensional semiconductor material is bonded to a metal electrode, atomic combination does not occur but a Van Der Waals gap is formed therebetween, so that it is difficult to transfer charges from the electrode to the semiconductor layer. As such, there is insufficient space to receive charges in the two-dimensional semiconductor and it is difficult for charges to be transferred due to the Van Der Waals gap, which causes a high contact resistance. Further, a large-scale two-dimensional semiconductor can be present as a p-type semiconductor in the air. In this case, if metal commonly used as an electrode material is brought into contact with the two-dimensional semiconductor, the two-dimensional semiconductor is doped into an n-type semiconductor. Therefore, when the metal electrode is brought into contact with the two-dimensional semiconductor, a density of states is reduced, so that a contact resistance may be increased.

Further, according to a method of reducing the contact resistance by bringing the electrode into contact with an edge of the two-dimensional semiconductor, the contact resistance can be reduced by increasing a path for charges to move from the electrode to a two-dimensional semiconductor material. However, in order to form the electrode on the edge of the two-dimensional semiconductor, the edge of the two-dimensional semiconductor and the electrode need to be aligned.

Accordingly, there is a need for a new method of forming an electrode for reducing the contact resistance between the two-dimensional semiconductor and the electrode in the process of manufacturing an electronic device using the two-dimensional semiconductor.

DISCLOSURE OF THE INVENTION

Problems to be Solved by the Invention

In view of the foregoing, some exemplary embodiments of the present disclosure provide a method of reducing a contact resistance between a two-dimensional semiconductor layer and an electrode in case of manufacturing an electronic device and an application device such as a photoelectric device using a two-dimensional semiconductor, and also provide the electronic device.

However, problems to be solved by the present disclosure are not limited to the above-described problems. There may be other problems to be solved by the present disclosure.

Means for Solving the Problems

According to an exemplary embodiment of the present disclosure, an electronic device using a two-dimensional semiconductor includes: a two-dimensional semiconductor layer doped into n-type or p-type; a first electrode formed on a first area of the two-dimensional semiconductor layer; and a second electrode formed on a second area of the two-dimensional semiconductor layer and spaced from the first electrode. Herein, patterns are formed in the first area and the second area, respectively, and the first electrode and the second electrode are formed on areas corresponding to the patterns, respectively.

According to another exemplary embodiment of the present disclosure, a method of forming electrodes for electronic device using a two-dimensional semiconductor includes: forming a two-dimensional semiconductor layer doped into n-type or p-type on a substrate; patterning a first area and a second area of the doped two-dimensional semiconductor layer into a predetermined pattern shape; and forming a first electrode and a second electrode on the patterned first and second areas, respectively. The first area and the second area are spaced from each other on the two-dimensional semiconductor layer.

Effects of the Invention

According to the above-described exemplary embodiments of the present disclosure, in an example suggested in the present disclosure, by doping a two-dimensional semiconductor material, a density of states of a two-dimensional semiconductor layer is increased. Thus, it is possible to reduce a contact resistance between the two-dimensional semiconductor layer and an electrode.

Further, by patterning an area of the two-dimensional semiconductor layer in contact with the electrode, a contact area between the electrode and the two-dimensional semiconductor area is increased. Thus, it is possible to reduce a contact resistance between the two-dimensional semiconductor layer and the electrode.

Furthermore, in an example suggested in the present disclosure, a contact resistance between the two-dimensional semiconductor layer and the electrode is reduced. Thus, it is possible to improve the performance of various electronic devices based on a two-dimensional semiconductor.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 3 is a flowchart provided to explain a process of forming a doped two-dimensional semiconductor layer on a substrate in detail in accordance with an example of the present disclosure.

FIG. 6 provides graphs showing a doping concentration of graphene depending on a PVP and PMF concentration considered in an example of the present disclosure.

DETAILED DESCRIPTION

Figure 1:
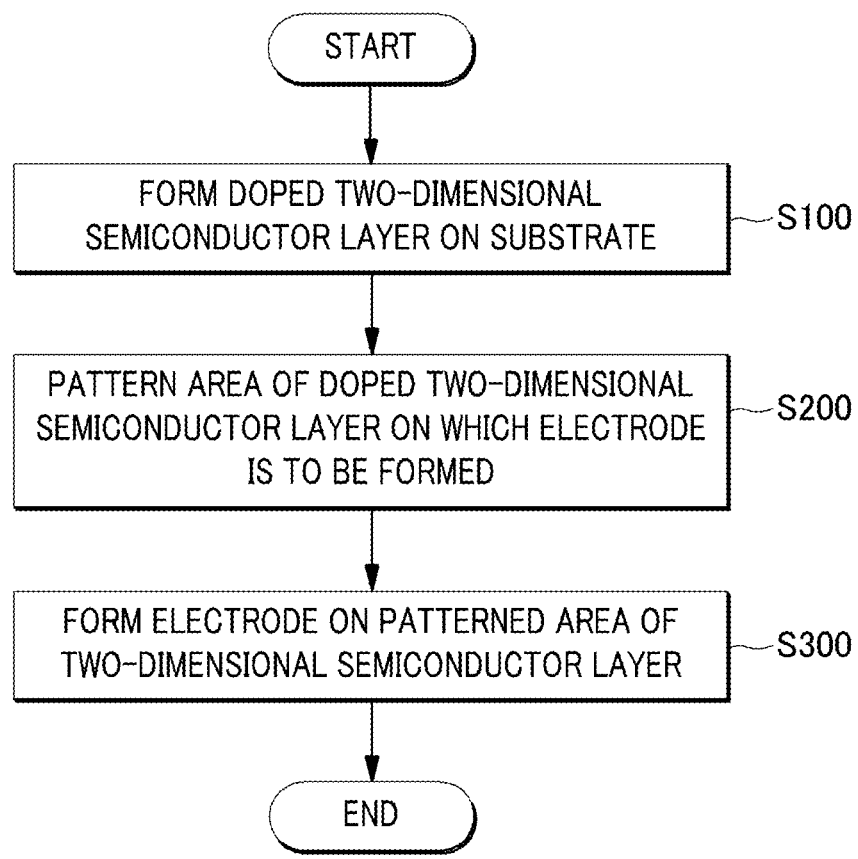
FIG. 1 is a flowchart provided to explain a method of forming electrodes for electronic device using a two-dimensional semiconductor in detail in accordance with an example of the present disclosure.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, the term "comprises or includes" and/or "comprising or including" used in the document means that one or more other components, steps, operation and/or existence or addition of elements are not excluded in addition to the described components, steps, operation and/or elements unless context dictates otherwise.

Hereinafter, a method of forming electrodes for electronic device using a two-dimensional semiconductor will be described in detail with reference to the accompanying drawings. For reference, in an example of the present disclosure, a semiconductor switch device will be described as an electronic device using a two-dimensional semiconductor, but the present disclosure may not be limited thereto. The electronic device using a two-dimensional semiconductor may include all of application devices such as a photoelectric device (e.g., solar cell) and a display device.

In an example of the present disclosure, the two-dimensional semiconductor refers to a semiconductor having a predetermined area and a thickness of several nm, and may be, for example, graphene. However, the present disclosure may not be limited thereto.

Figure 2:
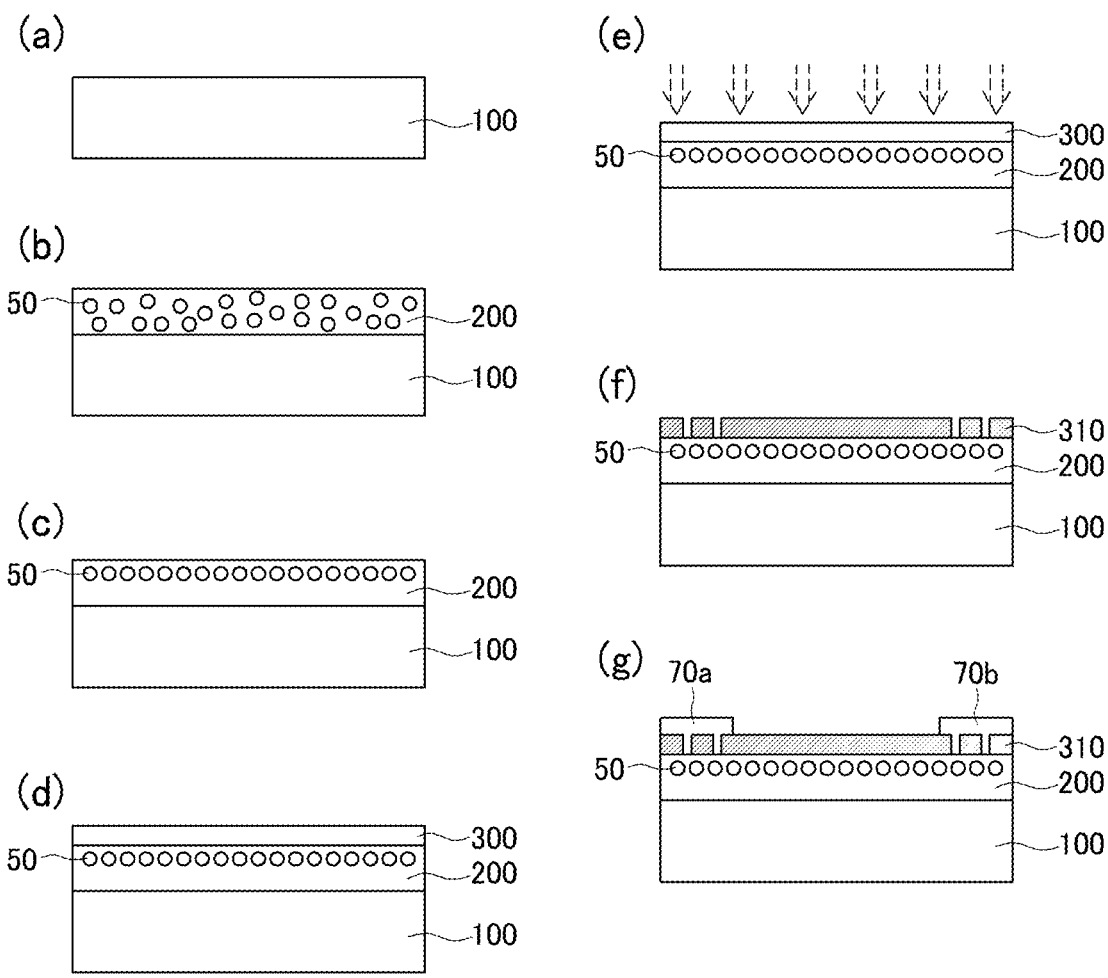
FIG. 2 schematically illustrates the method of forming electrodes for electronic device using a two-dimensional semiconductor in accordance with an example of the present disclosure.

FIG. 1 is a flowchart provided to explain a method of forming electrodes for electronic device using a two-dimensional semiconductor in detail in accordance with an example of the present disclosure, and FIG. 2 schematically illustrates the method of forming electrodes for electronic device using a two-dimensional semiconductor in accordance with an example of the present disclosure. Further, FIG. 3 is a flowchart provided to explain a process of forming a doped two-dimensional semiconductor layer on a substrate in detail in accordance with an example of the present disclosure.

Referring to FIG. 1, the method of forming electrodes for electronic device using a two-dimensional semiconductor in accordance with an example of the present disclosure includes: a step of forming a doped two-dimensional semiconductor layer on a substrate (S100); a step of patterning an area of the doped two-dimensional semiconductor layer on which an electrode is to be formed (S200); and a step of forming an electrode on the patterned area of the two-dimensional semiconductor layer (S300).

Herein, the step of forming a doped two-dimensional semiconductor layer on a substrate (S100) includes forming an insulation layer including a material (hereinafter, referred to as "doping material") capable of doping a two-dimensional semiconductor material on the substrate, forming a two-dimensional semiconductor layer on the insulation layer, and doping the two-dimensional semiconductor material. In this case, the two-dimensional semiconductor material may be doped into p-type or n-type.

For example, FIG. 3 illustrates a case of forming an insulation layer including photosensitive particles as the doping material. That is, the step of forming a doped two-dimensional semiconductor layer on a substrate (S100) may include: a step of forming the insulation layer including photosensitive particles on the substrate (S110); a step of moving the photosensitive particles to a surface of the insulation layer through a heat treatment (S120); a step of forming the two-dimensional semiconductor layer on the insulation layer (S130); and a step of doping the two-dimensional semiconductor material (S140), as illustrated in FIG. 3.

Hereinafter, each of the processes illustrated in FIG. 1 will be described in detail with reference to FIG. 2.

Firstly, the step (S100) illustrated in FIG. 1 will be described with reference to illustration (a) to illustration (e) of FIG. 2. For reference, illustration (a) to illustration (e) of FIG. 2 correspond to the step (S110) to the step (S140) illustrated in FIG. 3.

As illustrated in illustration (a) of FIG. 2, a substrate 100 is prepared. In this case, the substrate 100 is a substrate generally used for semiconductor device and may be formed using glass, quartz, silicon (Si), germanium (Ge), and the like. Further, a flexible plastic substrate including polyethylene phthalate (PET), polyethylene naphthalate (PEN), polyethylenimine (PEI), and the like may be used. The substrate is not limited to any one material.

Then, as illustrated in illustration (b) of FIG. 2, an insulation layer 200 including photosensitive particles 50 is formed on the substrate 100 (S110).

In this case, according to an example of the present disclosure, polyvinylpyrrolidone (PVP) and poly(melamine-co-formaldehyde) (PMF) may also be used as the doping material in addition to the photosensitive particles 50.

Further, the insulation layer 200 can be formed by coating the doping material on the insulation layer 200, and may be, for example, a self-assembly monolayer. In accordance with an example of the present disclosure, if the two-dimensional semiconductor material is graphene, the insulation layer 200 including a material capable of doping graphene into n-type may be formed. In this case, by adjusting a concentration of the doping material such as PMF, a doping concentration of the two-dimensional semiconductor can be adjusted. Further, thermal or optical activation corresponding to each kind of doping material may be further performed.

For example, the insulation layer 200 including the photosensitive particles 50 may be a phosphosilicate class (PSG), but may not be limited thereto. Herein, the photosensitive particles 50 are sensitive to light, and may be a photoinduced electron transfer (PET) material that absorbs photons and transfer electrons. For example, the photosensitive particles 50 may include any one or more of cadmium selenide (CdSe), titanium oxide (TiO2), and ruthenium compounds, but may not be limited thereto.

Meanwhile, the insulation layer 200 including the doping material such as the photosensitive particles 50 may be formed by any one deposition method from among chemical vapor deposition (CVD), plasma enhanced CVD (PECVD), low pressure CVD (LPCVD), physical vapor deposition (PVD), sputtering, or atomic layer deposition (ALD).

Then, as illustrated in illustration (c) of FIG. 2, the photosensitive particles 50 are moved to a surface of the insulation layer 200 (S120).

In this case, the photosensitive particles 50 may be moved to the surface of the insulation layer 200 through a heat treatment. For example, the substrate on which the insulation layer 200 including the photosensitive particles 50 may be placed in a furnace under a nitrogen atmosphere and then heated at a temperature of from about 700° C. to about 900° C. for 1 hour. Through the heat treatment as described above, the photosensitive particles 50 included in the insulation layer 200 may be spread and moved to the surface of the insulation layer 200.

Then, as illustrated in illustration (d) of FIG. 2, a two-dimensional semiconductor layer 300 is formed on the insulation layer 200 including the photosensitive particles 50 (S130).

In this case, the two-dimensional semiconductor layer 300 may be formed on the insulation layer 200 by performing any one of a peeling process of peeling ore of the two-dimensional semiconductor material with tape and then forming the two-dimensional semiconductor layer on the insulation layer 200 or a transferring process using a polymer, but may not be limited thereto. Meanwhile, according to the transferring process using a polymer, the two-dimensional semiconductor material may be grown to a large scale on the substrate through chemical vapor deposition, a polymer (generally, PMMA) is coated on the two-dimensional semiconductor material, the substrate is etched to separate only the polymer-coated two-dimensional semiconductor material, and the two-dimensional semiconductor material is floated on deionized water to be transferred onto the insulation layer 200. In this case, the two-dimensional semiconductor material may include any one of transition metal dichalcogenide, black phosphorus, silicene, germanene, and stanene-based materials, but may not be limited thereto.

Then, as illustrated in illustration (e) of FIG. 2, the two-dimensional semiconductor is doped (S140).

In this case, the substrate on which the two-dimensional semiconductor layer 300 is formed may be exposed to light having an intensity of from 100 nW to 1 mW for about several seconds to about several minutes. By this step (S140), a phase of the photosensitive particles 50 included in the insulation layer 200 is changed. The photosensitive particles 50 of which the phase is changed may cause an oxidation or reduction reaction. That is, the photosensitive particles 50 transfer charges to the two-dimensional semiconductor material through the oxidation or reduction reaction caused by light. Therefore, if the photosensitive particles are present around (above or under) the two-dimensional semiconductor material, the two-dimensional semiconductor material is doped. As such, the two-dimensional semiconductor material can be doped using the photosensitive particles. The degree of doping can be controlled precisely from a low level to a high level through optical activation. In this case, the light used for exposure may have a wavelength corresponding to an absorption wavelength of the photosensitive particles and may be any one of ultraviolet light, visible light, and infrared light, but may not be limited to a specific wavelength band. That is, the wavelength and intensity of the light for exposure may vary depending on the concentration and kind of the photosensitive particles and a design of process, but may not be limited to any one of them. For reference, the doping of the two-dimensional semiconductor material according to an example of the present disclosure may employ thermal or optical activation suitable for the kind of the doping material included in the insulation layer.

Meanwhile, in the step (S100) according to an example of the present disclosure, an annealing process may be further performed before the doping of the two-dimensional semiconductor material (S140). In this case, an annealing temperature may be about 500° C., but may not be limited thereto. Through the annealing process, an interface between the insulation layer 200 and the two-dimensional semiconductor material of the two-dimensional semiconductor layer 300 can be improved and the photosensitive particles 50 can be thermally activated.

As described above, according to the method of forming electrodes for electronic device using a two-dimensional semiconductor according to an example of the present disclosure, in the step of forming a doped two-dimensional semiconductor layer on a substrate (S100), a two-dimensional semiconductor material itself is doped to increase a density of states of the two-dimensional semiconductor material. Therefore, the amount of charges which can be moved from the electrode is increased. Thus, a contact resistance between the two-dimensional semiconductor and the electrode can be reduced.

Then, the step (S200) of FIG. 1 will be described in detail with reference to illustration (f) of FIG. 2.

As illustrated in illustration (f) of FIG. 2, in the patterning of an area of the doped two-dimensional semiconductor layer on which an electrode is to be formed (S200), a photoresist material is coated on a doped two-dimensional semiconductor layer 310 and patterned through electron-beam lithography. Then, a pattern is formed in the doped two-dimensional semiconductor layer 310 through an etching process. For example, the pattern may be formed at an edge of the doped two-dimensional semiconductor layer 310, but may not be limited in position.

The pattern is formed through the etching process of patterning and may be a trench having a predetermined depth, but may not be limited thereto. Further, multiple surfaces (e.g., edge surface) may be included within the trench. The pattern may be formed on left and right sides or upper and lower sides of the two-dimensional semiconductor layer to face each other, the position and direction of the pattern may not be limited thereto.

Figure 4A:
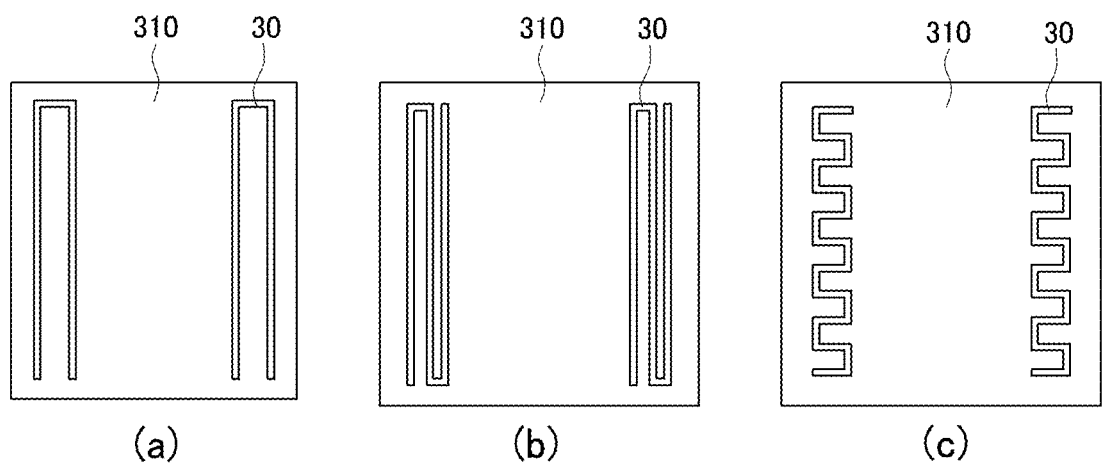
FIG. 4A illustrates various examples of a patterned two-dimensional semiconductor layer in accordance with an example of the present disclosure.
Figure 4B:
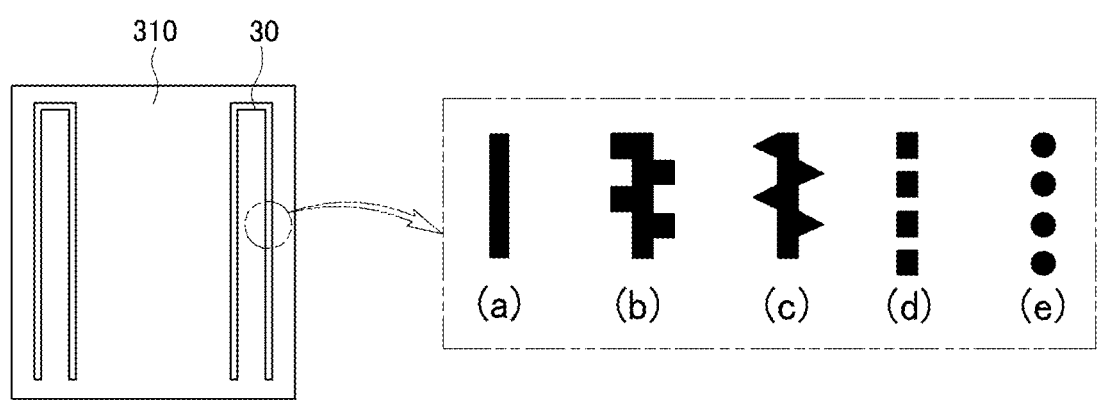
FIG. 4B illustrates various examples of a detailed pattern shape in accordance with an example of the present disclosure.
Figure 5:
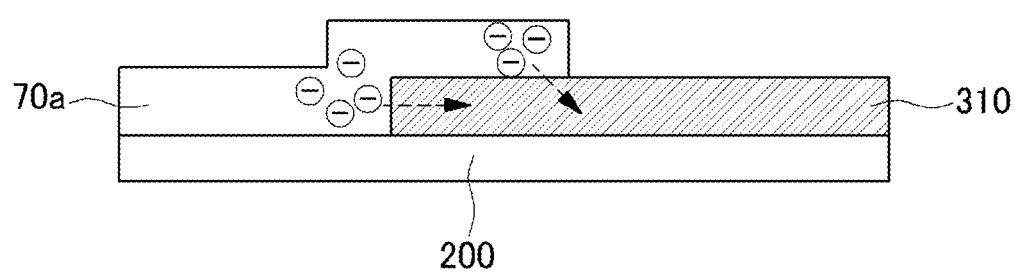
FIG. 5 schematically illustrates a partial cross-section of an electrode formed on a doped two-dimensional semiconductor in accordance with an example of the present disclosure.

FIG. 4A illustrates various examples of a patterned two-dimensional semiconductor layer in accordance with an example of the present disclosure, and FIG. 4B illustrates various examples of a detailed pattern shape in accordance with an example of the present disclosure. Further, FIG. 5 schematically illustrates a partial cross-section of an electrode formed on a doped two-dimensional semiconductor in accordance with an example of the present disclosure.

Specifically, FIG. 4A and FIG. 4B illustrate linear patterns, and illustrate that two or more lines are formed in parallel with each other in a single pattern area. In this case, the number of lines formed in a single pattern area is not limited. At least one end of each of two lines may be connected to each other, so that the two lines can be connected as a substantially single line. Further, referring to illustration (a) and illustration (b) of FIG. 4A, it can be seen that a width between lines within a single pattern area is narrower in illustration (b) than in illustration (a) of FIG. 4A. As such, as the number of lines in parallel with each other in a single pattern area is increased, a length of the pattern is increased. Further, illustration (c) of FIG. 4A illustrates zigzag lines instead of straight lines. The pattern in the two-dimensional semiconductor layer according to an example of the present disclosure is not limited to the pattern shapes illustrated in FIG. 4A.

Further, illustration (a) to illustration (e) of FIG. 4B illustrate linear patterns, respectively, and specifically illustrate straight line-, sawtooth-, saw blade-, rectangular hole-, circular hole-shaped patterns in detail. In this case, illustration (a) to illustration (e) of FIG. 4B illustrate that each detailed pattern shape is formed repeatedly in one or more directions at a predetermined distance along a line. The detailed pattern shape in the two-dimensional semiconductor layer according to an example of the present disclosure is not limited to the shapes illustrated in FIG. 4B. The pattern may be formed into a random shape instead of a linear shape at a random position.

As described above with respect to FIG. 4A and FIG. 4B, the total length or the area of a pattern formed in the same area may vary depending on the width and shape of the two-dimensional semiconductor layer. Therefore, a contact area of the two-dimensional semiconductor in contact with the electrode may vary. That is, a pattern 30 may be formed to increase the surfaces of the trench in the two-dimensional semiconductor layer in contact with the electrode. Therefore, in an example of the present disclosure, a contact resistance between the two-dimensional semiconductor layer and the electrode can be reduced due to the pattern.

Then, the step (S300) illustrated in FIG. 1 will be described in detail with reference to illustration (g) of FIG. 2.

As illustrated in illustration (g) of FIG. 2, in the step of forming an electrode on the patterned area of the two-dimensional semiconductor layer (S300), an electrode material is formed on an area of the doped two-dimensional semiconductor layer and patterned through photolithography to form electrodes 70a and 70b.

Specifically, the electrode material may be formed by any one method from among deposition methods such as chemical vapor deposition, plasma enhanced CVD (PECVD), low pressure CVD (LPCVD), physical vapor deposition (PVD), sputtering, and atomic layer deposition (ALD), electroplating, and electroless plating.

In this case, the electrode material for forming the electrodes 70a and 70b may include any one or more materials from among metals such as gold, silver, copper, and aluminum or materials for forming a transparent electrode such as ITO, graphene, etc. In this case, the electrode material according to an example of the present disclosure may be a material capable of changing a density of states of the two-dimensional semiconductor material for forming the two-dimensional semiconductor layer 300.

As described above, after the electrode material is formed on the doped two-dimensional semiconductor layer 310, a resist is coated on the electrode material and then patterned through photolithography or E-beam lithography to form electrodes. Then, the electrodes 70a and 70b are formed through an etching process.

In this case, referring to FIG. 5, the electrodes are formed on the pattern of the doped two-dimensional semiconductor layer 310. Therefore, a contact area between the electrodes 70a and 70b and the doped two-dimensional semiconductor layer 310 is increased. That is, a path for electrons to move from the electrodes 70a and 70b to the doped two-dimensional semiconductor layer 310 is increased. Therefore, a contact resistance between the doped two-dimensional semiconductor layer 310 and the electrodes 70a and 70b is reduced.

Specifically, metal which is a three-dimensional material has a sufficient amount of charges (electrons/holes) to be transferred to a semiconductor layer, whereas a two-dimensional semiconductor material is limited in space to receive charges transferred from metal and thus has a high contact resistance. Further, the two-dimensional semiconductor material does not include a dangling bond on its surface. Therefore, if the two-dimensional semiconductor material is bonded to a metal electrode, atomic combination does not occur but a Van Der Waals gap is formed therebetween, so that it is difficult to transfer charges from the electrode to the semiconductor layer. Accordingly, there is insufficient space to receive charges in the two-dimensional semiconductor and it is difficult for charges to be transferred due to the Van Der Waals gap, which causes a high contact resistance. In order to solve this problem, in an example of the present disclosure, a space to receive charges (i.e., density of states) is increased in the two-dimensional semiconductor material through a doping process and a pattern is formed in the doped two-dimensional semiconductor layer to reduce an effect of the Van Der Waals gap. Thus, a chemical bonding area between the two-dimensional semiconductor material and the metal electrode is increased, so that charges can be readily moved between the electrode and the two-dimensional semiconductor layer.

EXAMPLES

A doped two-dimensional semiconductor was formed on a substrate using the above-described method of forming electrodes for electronic device using a two-dimensional semiconductor according to an example of the present disclosure. In this case, graphene was used as the two-dimensional semiconductor material for forming the two-dimensional semiconductor layer 300 and PVP and PMF were used as the doping material.

In accordance with an example of the present disclosure, a doping concentration of the two-dimensional semiconductor can be adjusted by adjusting a concentration of PMF as described above.

FIG. 6 provides graphs showing a doping concentration of graphene depending on a PVP and PMF concentration considered in an example of the present disclosure.

Referring to illustration (a) of FIG. 6, it can be seen that as the concentration of PMF is increased, the intensity of light according to Raman is increased. Further, referring to illustration (b) of FIG. 6, it can be seen that as the concentration of PMF is increased, an n-type area of graphene is increased.

Figure 7:
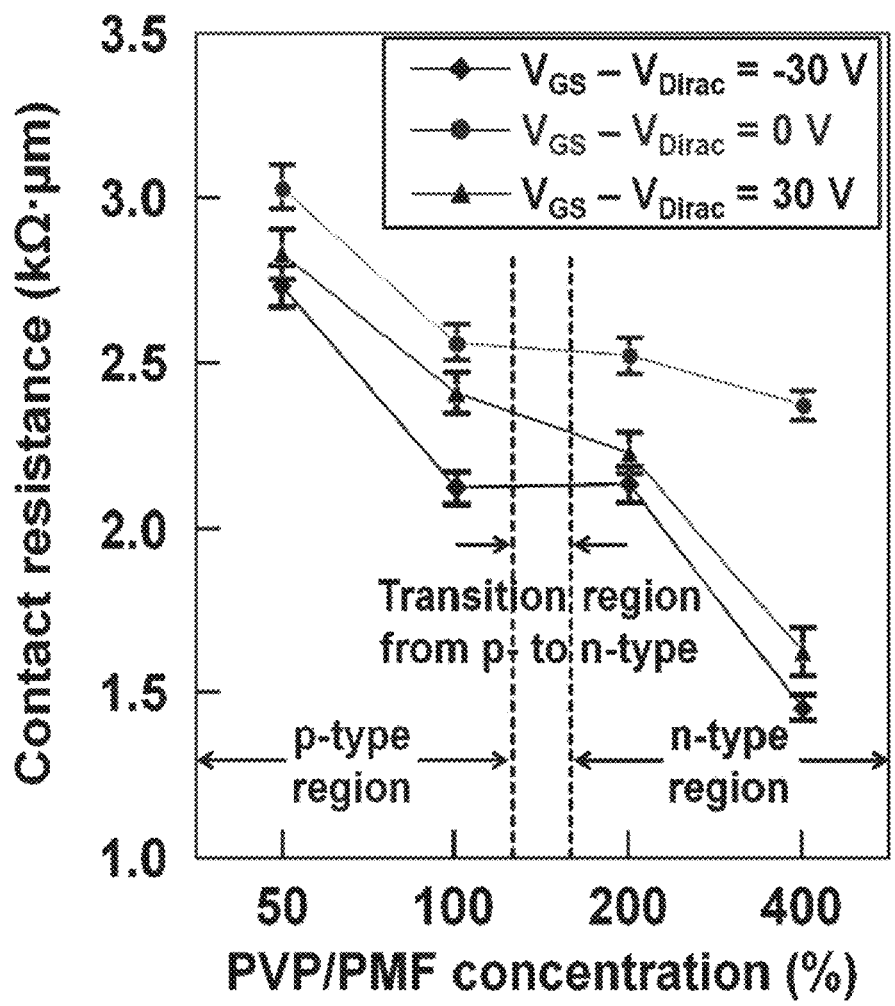
FIG. 7 is a graph showing the result of measurement of a contact resistance in electronic devices manufactured differently depending on a doping concentration in an example of the present disclosure.

FIG. 7 is a graph showing the result of measurement of a contact resistance in electronic devices manufactured differently depending on a doping concentration in an example of the present disclosure.

Referring to FIG. 7, it can be seen that as the two-dimensional semiconductor material (graphene) is doped into n-type, a contact resistance is reduced.

Figure 8:
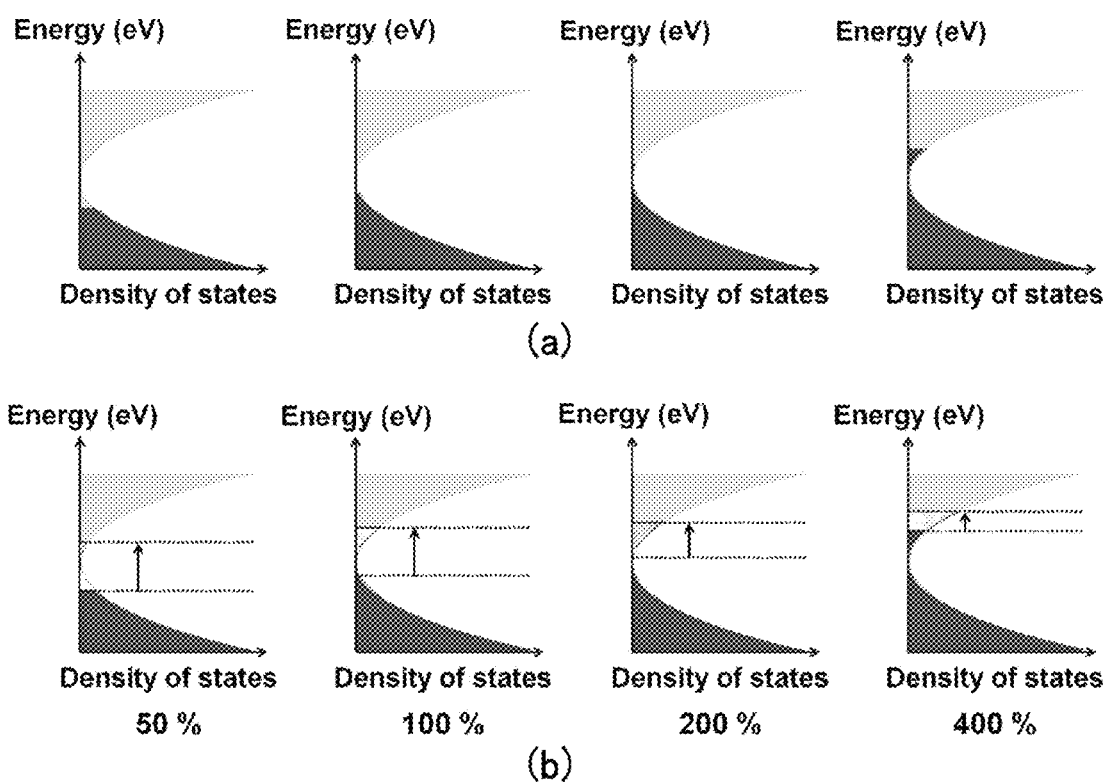
FIG. 8 provides graphs showing densities of states before and after an electrode is brought into contact with doped graphene in accordance with an example of the present disclosure.

FIG. 8 provides graphs showing densities of states before and after an electrode is brought into contact with doped graphene in accordance with an example of the present disclosure.

Referring to illustration (a) of FIG. 8, it can be seen that before the electrode is formed, as the two-dimensional semiconductor material, graphene, is doped into n-type, a density of states of graphene itself is increased. Further, referring to illustration (b) of FIG. 8, it can be seen that after the electrode is brought into contact with graphene, the density of states of graphene is further increased.

Figure 9:
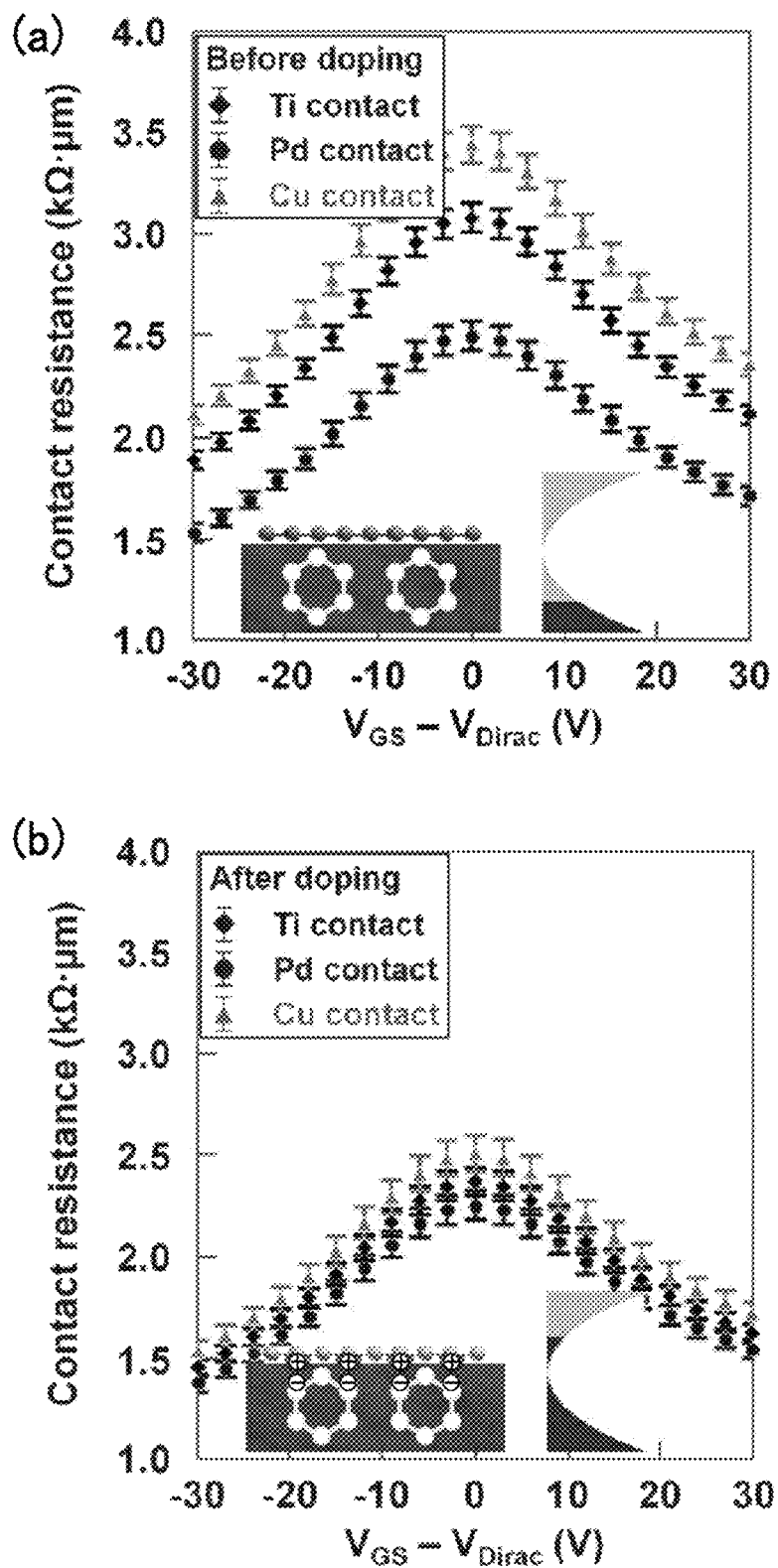
FIG. 9 provides graphs showing a change in contact resistance when electrodes are formed using a two-dimensional semiconductor with various kinds of materials in accordance with an example of the present disclosure.

FIG. 9 provides graphs showing a change in contact resistance when electrodes are formed using a two-dimensional semiconductor with various kinds of materials in accordance with an example of the present disclosure.

Illustration (a) of FIG. 9 illustrates a change in contact resistance of each electrode material when electrodes are formed on undoped graphene using different materials. Further, illustration (b) of FIG. 9 illustrates a change in contact resistance of each electrode material when electrodes are formed on doped graphene using different materials. Referring to illustration (b) of FIG. 9, graphene was doped with 40% PVP/PMF. Further, referring to illustration (a) and illustration (b) of FIG. 9, titanium (Ti), copper (Cu), and palladium (Pd) were used as electrode materials.

Referring to illustration (a) and illustration (b) of FIG. 9, it can be seen that when Pd was used as an electrode material, a contact resistance was the lowest before and after doping. Further, it can be seen that a contact resistance was lower in case of using the doped graphene than in case of using the undoped graphene.

Figure 10A:
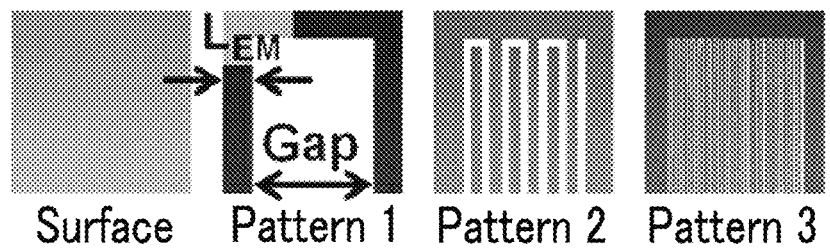
FIG. 10A illustrates two-dimensional semiconductor layers patterned differently in accordance with an example of the present disclosure.
Figure 10B:
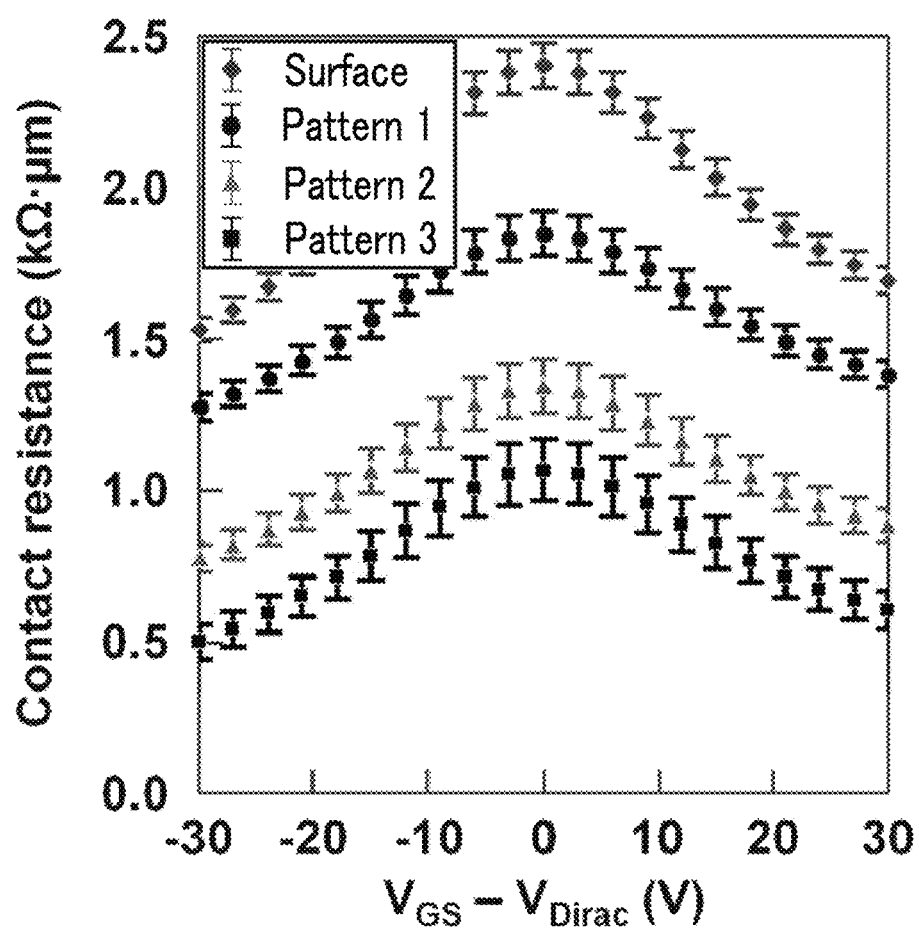
FIG. 10B is a graph showing the result of measurement of a change in contact resistance depending on a pattern shape of a patterned two-dimensional semiconductor illustrated in FIG. 10A.

FIG. 10A illustrates two-dimensional semiconductor layers patterned differently in accordance with an example of the present disclosure, and FIG. 10B is a graph showing the result of measurement of a change in contact resistance depending on a pattern shape of a patterned two-dimensional semiconductor illustrated in FIG. 10A.

Referring to FIG. 10A and FIG. 10B, a contact resistance between a two-dimensional semiconductor and an electrode may vary depending on a shape of a pattern area of the two-dimensional semiconductor in contact with the electrode. More specifically, it can be seen that as a length of a pattern of the two-dimensional semiconductor in contact with the electrode is increased, a contact area between the two-dimensional semiconductor and the electrode is increased, so that the contact resistance is reduced.

Figure 11:
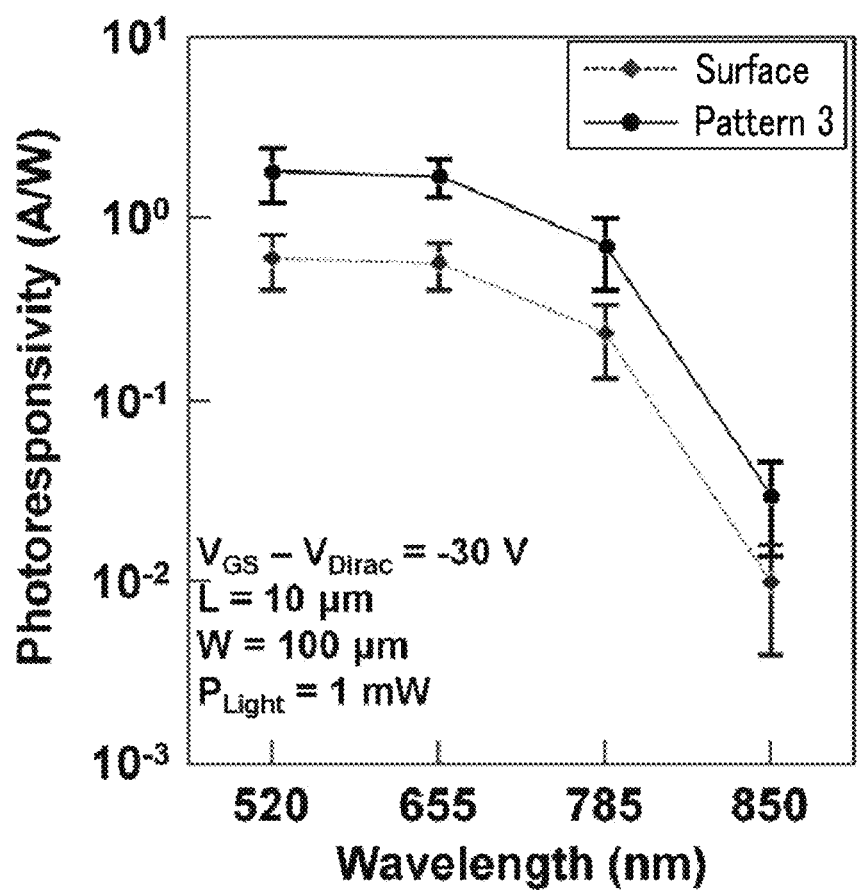
FIG. 11 is a graph showing a photoresponsivity of a photodetector using a two-dimensional semiconductor and manufactured by a method of forming electrodes in accordance with an example of the present disclosure.

FIG. 11 is a graph showing a photoresponsivity of a photodetector using a two-dimensional semiconductor and manufactured by a method of forming electrodes in accordance with an example of the present disclosure.

More specifically, FIG. 11 is a graph showing the result of measurement of a photoresponsivity of a graphene/perovskite hybrid photodetector in order to find out an effect of a reduction in contact resistance on the performance of an application device using a two-dimensional semiconductor.

FIG. 11 shows a photoresponsivity of each of the case where a contact area between graphene/perovskite and an electrode is a surface illustrated in FIG. 10A and the case where the contact area is patterned into the same shape as a pattern 3 illustrated in FIG. 10A.

Referring to FIG. 11, it can be seen that as a length of the formed pattern is increased, a contact resistance is reduced, so that a photoresponsivity of the photodetector having the pattern 3 with a relatively reduced contact resistance is improved.

Figure 12:
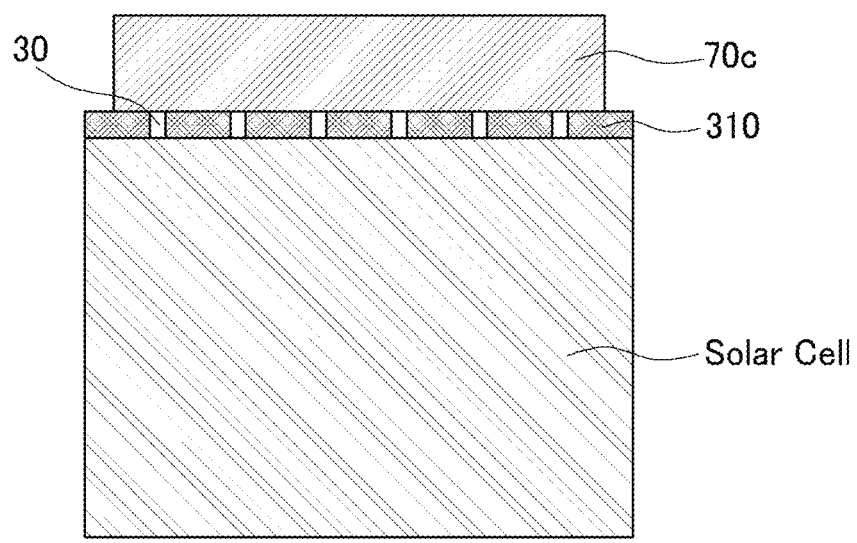
FIG. 12 illustrates a solar cell device using a two-dimensional semiconductor in accordance with an example of the present disclosure.

In FIG. 12, a solar cell is illustrated as an application device using the doped two-dimensional semiconductor device according to an example of the present disclosure. FIG. 12 illustrates a cross-sectional view of a solar cell device on which the doped two-dimensional semiconductor layer 310 and a metal electrode 70c are formed.

Further, FIG. 12 illustrates that graphene is used for the doped two-dimensional semiconductor layer 310 and used as a graphene transparent electrode on the solar cell. If the doped two-dimensional semiconductor layer is used as a transparent electrode on the solar cell as such, the metal electrode 70c is placed on the graphene transparent electrode 310 in which the pattern 30 is formed, so that a contact resistance can be reduced and a high performance can be secured.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure.

The scope of the present disclosure is defined by the following claims rather than by the detailed description of the embodiment. It shall be understood that all modifications and embodiments conceived from the meaning and scope of the claims and their equivalents are included in the scope of the present disclosure.

EXPLANATION OF CODES

30: Pattern
50: Photosensitive particles
70a, 70b, 70c: Electrode
100: Substrate
200: Insulation layer including photosensitive particles
300: Two-dimensional semiconductor layer
310: Doped two-dimensional semiconductor layer

We claim:

1. An electronic device using a two-dimensional semiconductor, comprising:
a two-dimensional semiconductor layer disposed on an insulation layer and comprising a plurality of patterned portions selectively exposing the insulation layer;
a first electrode disposed on a first portion of the plurality of patterned portions of the two-dimensional semiconductor layer; and
a second electrode disposed on a second portion of the plurality of patterned portions of the two-dimensional semiconductor layer and spaced apart from the first electrode,
wherein each of the first portion and second portion has two or more patterned portions,
wherein the respective electrode is disposed directly on upper and side surfaces of the two or more patterned portions of the two-dimensional semiconductor layer and on the exposed insulation layer, and
wherein the insulation layer comprises photosensitive particles, and the photosensitive particles comprise cadmium selenide (CdSe), titanium oxide (TiO2), or ruthenium compounds.

2. The electronic device using a two-dimensional semiconductor of claim 1, wherein the two-dimensional semiconductor layer has an n-type conductivity or a p-type conductivity.

3. The electronic device using a two-dimensional semiconductor of claim 1, wherein the photosensitive particles are sensitive to light and comprise a photoinduced electron transfer (PET) material that absorbs photons and transfers electrons.

4. The electronic device using a two-dimensional semiconductor of claim 1, wherein the insulation layer comprises a doping material that comprises polyvinylpyrrolidone (PVP) or poly(melamine-co-formaldehyde) (PMF) for doping the two-dimensional semiconductor layer comprising graphene.

5. The electronic device using a two-dimensional semiconductor of claim 4, wherein the insulation layer comprises the doping material in addition to photosensitive particles.

* * * * *